(12) United States Patent
Lin

(10) Patent No.: US 7,473,519 B2
(45) Date of Patent: Jan. 6, 2009

(54) METHOD FOR MANUFACTURING ELECTRODES OF A PLASMA DISPLAY PANEL

(75) Inventor: Ching-Hui Lin, Tao-Yuan Hsien (TW)

(73) Assignee: Chunghwa Picture Tubes, Ltd., Taipei (TW)

( * ) Notice: Subject to any disclaimer, the term of this patent is extended or adjusted under 35 U.S.C. 154(b) by 0 days.

(21) Appl. No.: 11/696,192

(22) Filed: Apr. 4, 2007

(65) Prior Publication Data

US 2007/0172771 A1 Jul. 26, 2007

Related U.S. Application Data

(63) Continuation of application No. 10/907,832, filed on Apr. 18, 2005, now Pat. No. 7,238,463.

(51) Int. Cl.
*H01J 9/201* (2006.01)
(52) U.S. Cl. .................. 430/319; 430/321; 430/396
(58) Field of Classification Search .................. None
See application file for complete search history.

(56) References Cited

U.S. PATENT DOCUMENTS 4,231,811 A 11/1980 Somekh et al.

6,577,374 B1 6/2003 Nakata et al.
2005/0068267 A1 3/2005 Yohioka et al.

FOREIGN PATENT DOCUMENTS

JP 2005-026138 A 1/2005

*Primary Examiner*—John A. McPherson
(74) *Attorney, Agent, or Firm*—Winston Hsu

(57) ABSTRACT

A method for manufacturing electrodes of a plasma display panel includes providing a front transparent substrate including transparent electrodes on the front transparent substrate, coating a black photosensitive paste film and a main photosensitive conductive paste film of negative-working type on the transparent electrodes, exposing the black photosensitive paste film and main photosensitive conductive paste film to define bus electrodes on the transparent electrodes, wherein exposure energy acting on main regions of the bus electrodes is greater than exposure energy acting on edge regions of the bus electrodes, developing the black photosensitive paste film and main photosensitive conductive paste film to form the bus electrodes, in which a thickness of the edge regions of the bus electrodes is less than a thickness of the main regions of the bus electrodes, and firing the black photosensitive paste film and main photosensitive conductive paste film.

10 Claims, 20 Drawing Sheets

METHOD FOR MANUFACTURING ELECTRODES OF A PLASMA DISPLAY PANEL

CROSS REFERENCE TO RELATED APPLICATIONS

This is a continuation application of U.S. application Ser. No. 10/907,832 filed Apr. 18, 2005 now U.S. Pat. No. 7,238,463.

BACKGROUND OF THE INVENTION

1. Field of the Invention

The present invention relates to a method for manufacturing electrodes of a plasma display panel (hereafter referred as PDP), and more particularly, to a method for manufacturing electrodes for preventing electrodes from experiencing edge curl effects and for increasing the quality of the PDP.

2. Description of the Prior Art

Recently, the field of multimedia applications is developing quickly. Users have a great demand for entertainment equipment. Conventionally, the cathode ray tube (CRT) display is commonly used. However, the cathode ray tube display does not meet the needs of multimedia technology because of it has a large volume. Therefore, many flat panel display technologies such as liquid crystal display (LCD), PDP, and field emission display (FED) have been developed. These display technologies are capable of manufacturing a thin, light, short and small monitor, and thus these technologies are going to be the mainstream technology for the future. Among these technologies, the PDP is attracting attention in the field of displays as a full-color display apparatus having a large size display area and is especially popular for use as a large size television or an outdoor display panel. This is because of its capability of serving as a high quality display resulting from the fact that it is a self-light emitting type display, has a wide angle of visibility, and has a short response time. Furthermore, the dimensions of the PDP can easily be increased in scale due to its simplicity in the manufacturing process.

A color PDP is a display in which ultraviolet rays are produced by gas discharge to excite phosphors so that visible lights are emitted therefrom to perform a display operation. Generally, a 3-electrode type PDP including a common electrode, a scan electrode and an address electrode is employed in the AC type PDP.

In a conventional 3-electrode AC type PDP, the address electrodes are disposed between parallel barrier ribs on a rear substrate. A plurality pair of conductive electrodes are arranged in parallel, and each pair of the conductive electrodes, including the common electrode and the scan electrode, is disposed in a direction perpendicular to the address electrodes and barrier ribs, thereby a plurality of ruminant cells are scaled therein.

The common and scan electrodes generally include a transparent electrode and a bus electrode. The transparent electrode is formed by the material indium tin oxide (ITO) (e.g., a mixture of $In_2O_3$ and $SnO_2$). The conductivity of the transparent electrode is low in comparison with that of metal and therefore a narrow width and fine conductive layer is added as the bus electrode on the transparent electrode to enhance its conductivity. The gap between the common electrode and scan electrode is set to obtain preferred fire voltage. A sustaining voltage is applied to the common electrode and the scan electrode to drive the PDP.

According to the above description, we know that electrodes are key units of a PDP and thus the method for manufacturing electrodes is very important. Please refer to FIG. 1 to FIG. 3. FIG. 1 to FIG. 3 are schematic diagrams for illustrating a method for manufacturing electrodes of a PDP according to the prior art. As shown in FIG. 1, a front substrate 10, for example, glass or other transparent boards, is provided. Transparent electrodes 12 and 14 formed by the material of ITO are disposed on the front substrate 10 and a discharge gap 16 is present between the transparent electrodes 12 and 14. A black photosensitive paste film 18 of negative-working type and a main photosensitive conductive paste film 20 of negative-working type cover the front substrate 10, the transparent electrode 12, and the transparent electrode 14. Then, utilizing a photo mask 22, an exposure process is performed. The photo mask 22 includes a shade region 24 and an opening region 26. In the exposure process, light 27, for example, a collimated ultraviolet (UV) light passes through the opening region 26 and is blocked by the shade region 24.

As shown in FIG. 2, after the exposure process, a development process is performed for patterning the black photosensitive paste film 18 and the main photosensitive conductive paste film 20. Because the black photosensitive paste film 18 and the main photosensitive conductive paste film 20 are negative-working type, areas covered by the shade region 24 are removed to form bus electrodes 28 and 30. Since the exposure of the bottom region of the bus electrodes 28 and 30 is less than the exposure of the top region of the bus electrodes 28 and 30, especially in the edges of the bus electrodes 28 and 30, the bus electrodes 28 and 30 look like trapezoids, in which an upper side is wider than a lower side.

As shown in FIG. 3, a firing process is performed. A tensile force occurs while high temperature firing and causes the edges of the bus electrodes 28 and 30 to not adhere to the transparent electrodes 12 and 14 well. Therefore, edge curls 32, 34, 36, and 38 of the bus electrodes 28 and 30 occur.

In the prior art, the height of the edge curls 32, 34, 36, and 38 is approximately 1-10 microns and the thickness of the buses 28 and 30 is approximately 2-20 microns. A dielectric layer cannot easily be formed under the edge curls 32, 34, 36, and 38 and air bubbles will be formed, causing breakdown around the edge curls 32, 34, 36, and 38. This will seriously influence the quality of the PDP. There are two methods for improving the edge curls 32, 34, 36, and 38: decreasing the thickness of the bus electrodes 28 and 30 and changing the component of the black photosensitive paste film 18 and the main photosensitive conductive paste film 20 to increase the adhesion ability between the bus electrodes 28 and 30 and the transparent electrodes 12 and 14. However, the two methods both will influence the resistance of the electrodes.

SUMMARY OF THE INVENTION

It is therefore an objective of the present invention to provide a method for manufacturing electrodes of a plasma display panel for preventing the edge curl and increasing the quality of the electrodes.

According to the present invention, a method for manufacturing electrodes of a plasma display panel includes the following steps. In the first step, a front transparent substrate including a plurality of transparent electrodes disposed on the front transparent substrate is provided. In the second step, a black photosensitive paste film of negative-working type is coated on the transparent electrodes. In the third step, a main photosensitive conductive paste film of negative-working type is coated on the black photosensitive paste film. In the fourth step, an exposure process is performed for exposing the black photosensitive paste film and the main photosensitive conductive paste film to define a plurality of bus electrodes on the corresponding transparent electrodes, wherein a first exposure energy acting on a plurality of main regions of the bus electrodes is greater than a second exposure energy acting on a plurality of edge regions of the bus electrodes. In the fifth step, a development process is performed to develop the exposed black photosensitive paste film and main photosensitive conductive paste film to form the bus electrodes, in which a first thickness of the edge regions of the bus electrodes is less than a second thickness of the main regions of the bus electrodes. In the sixth step, a firing process is performed to fire the developed black photosensitive paste film and main photosensitive conductive paste film.

It is an advantage of the present invention that the manufactured electrodes are capable of preventing the edge curl and then reducing the breakdown probability of dielectrics near edges of the electrodes.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
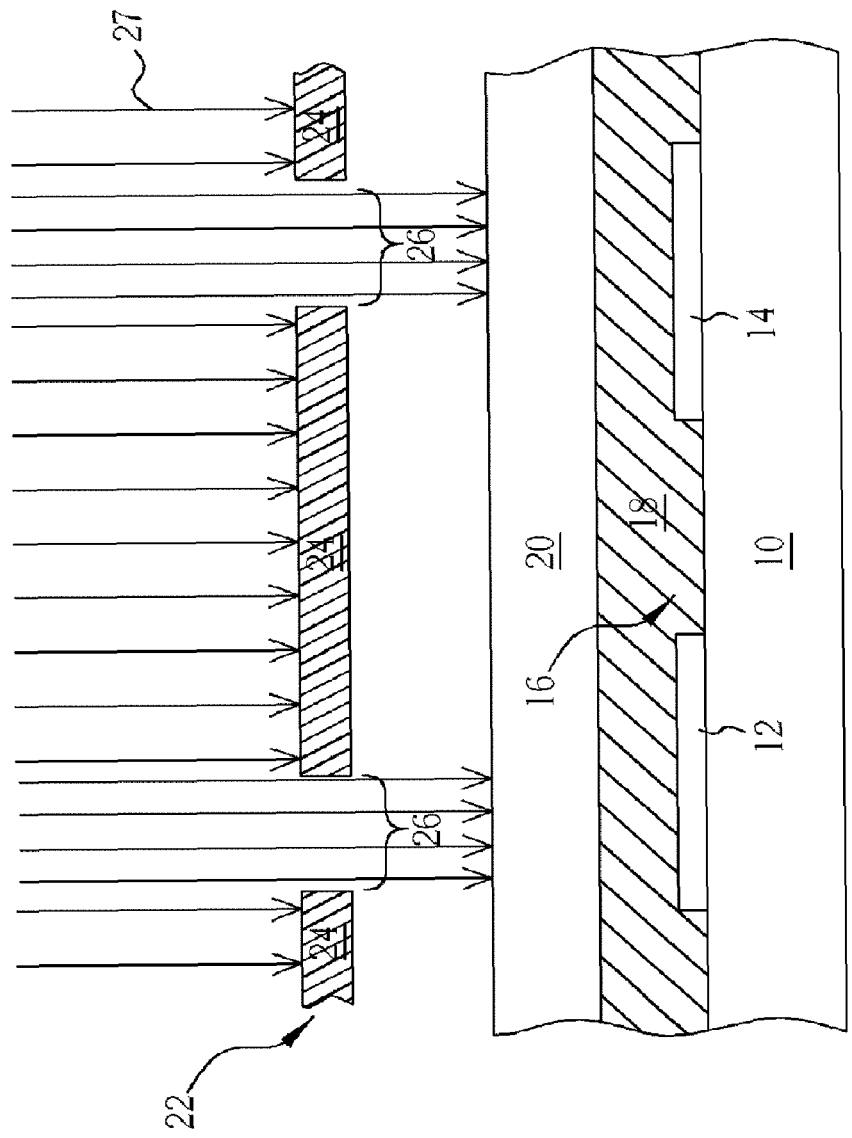
FIG. 1 to FIG. 3 are schematic diagrams for illustrating a method for manufacturing electrodes of a PDP according to the prior art.
Figure 2:
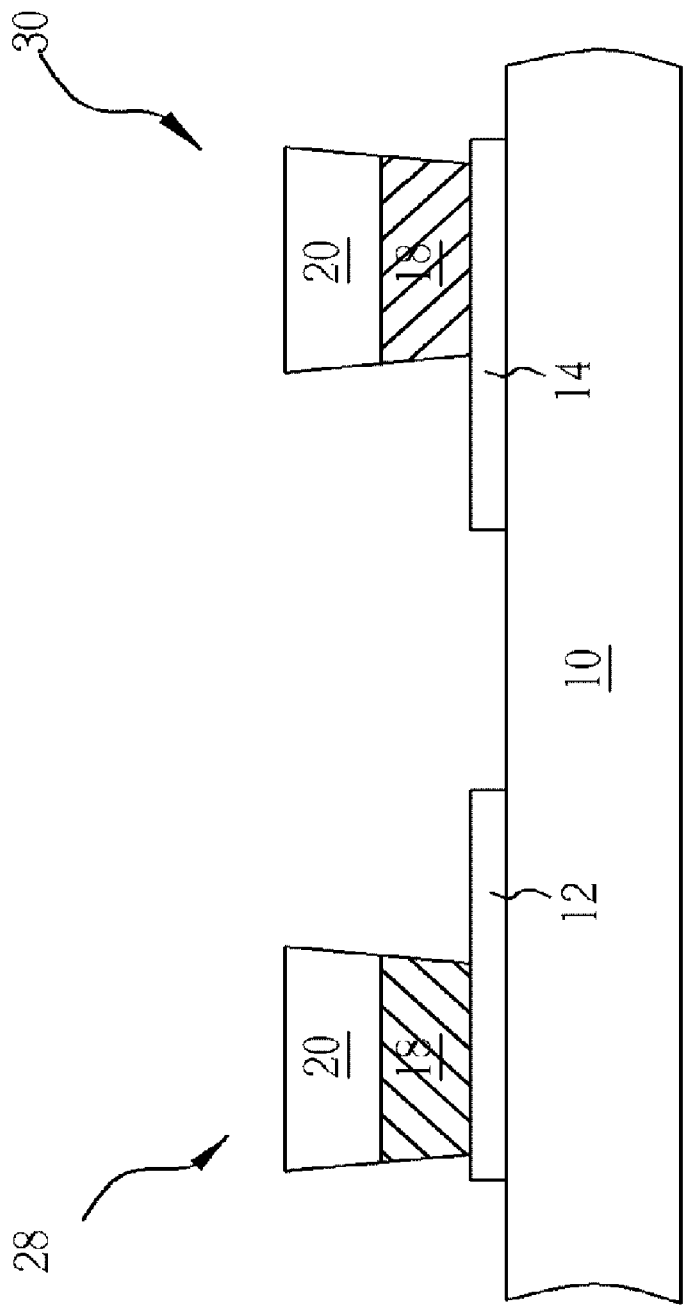
Figure 3:
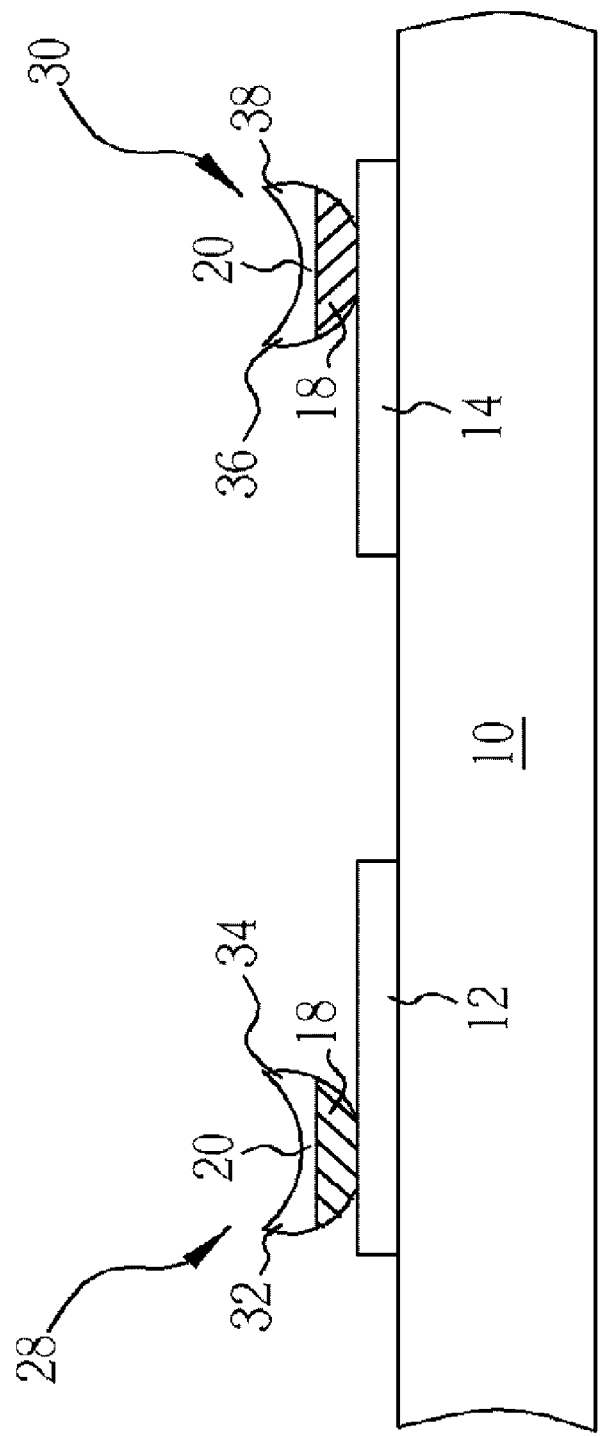
Figure 4:
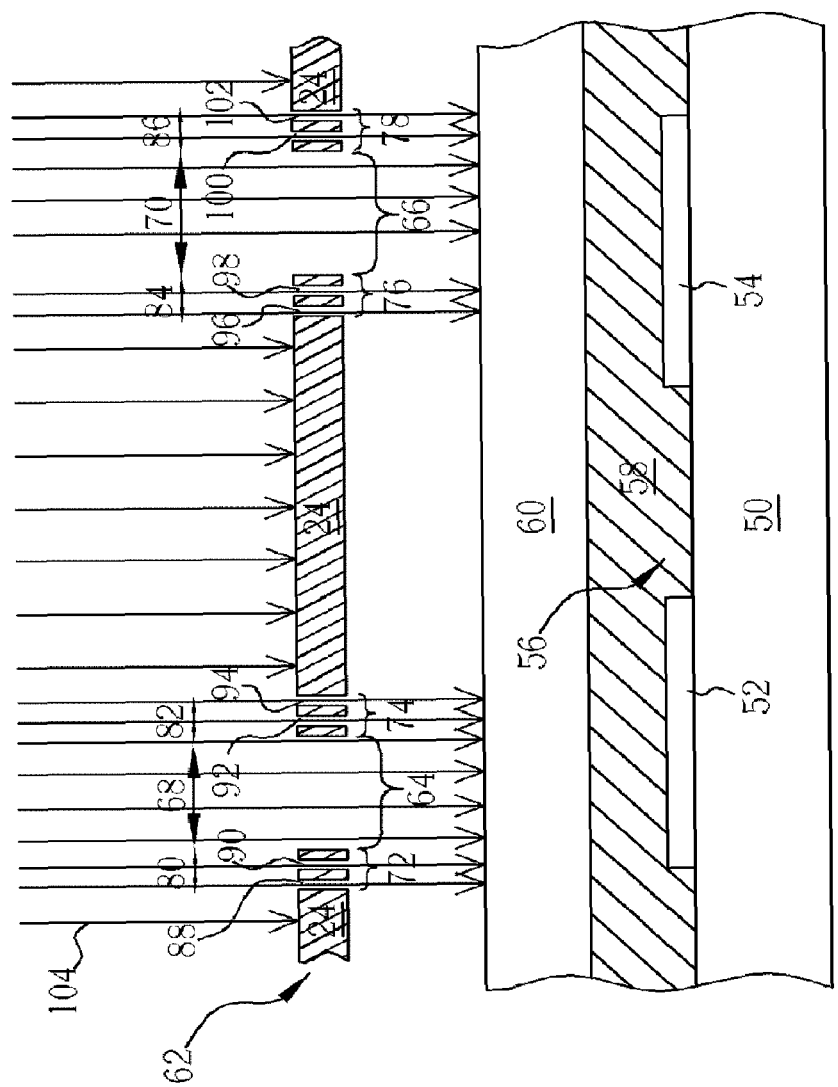
FIG. 4 to FIG. 6 are schematic diagrams illustrating a method for manufacturing electrodes of a PDP according to a first preferred embodiment of the present invention.
Figure 5:
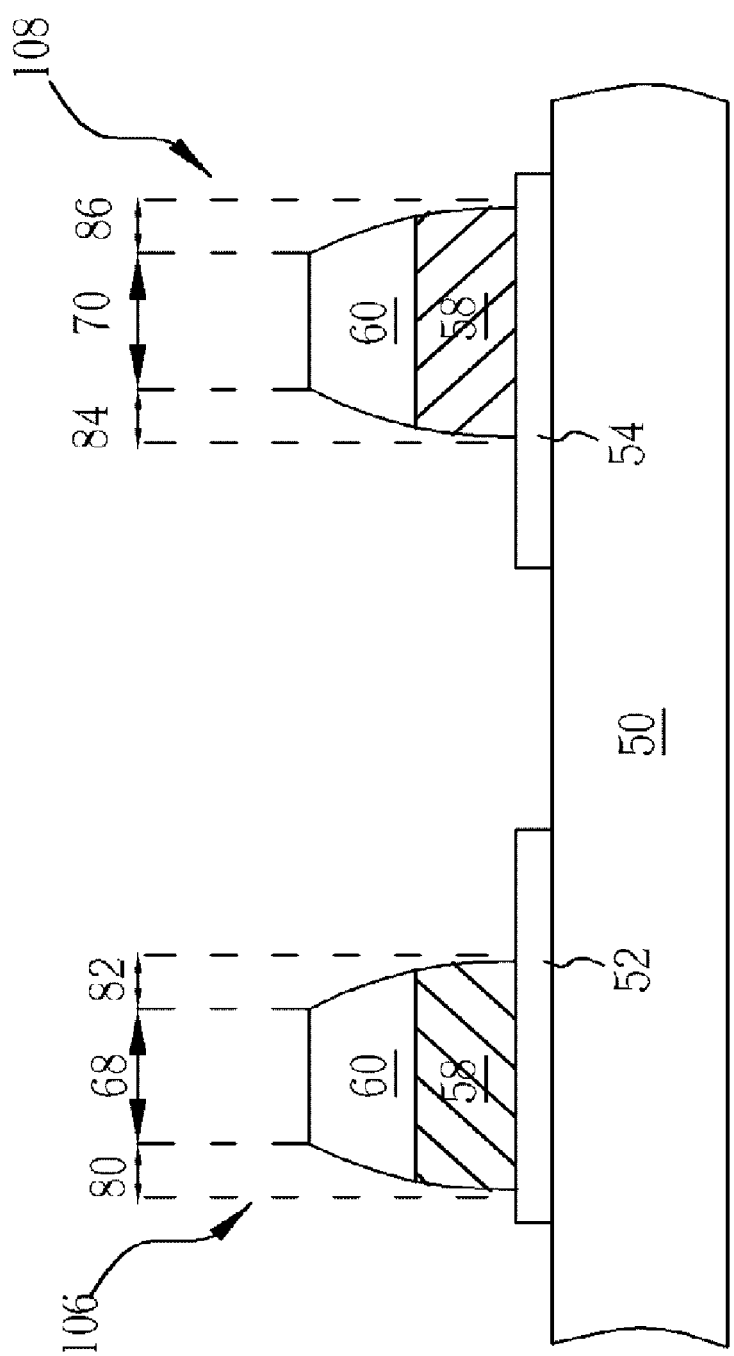
Figure 6:
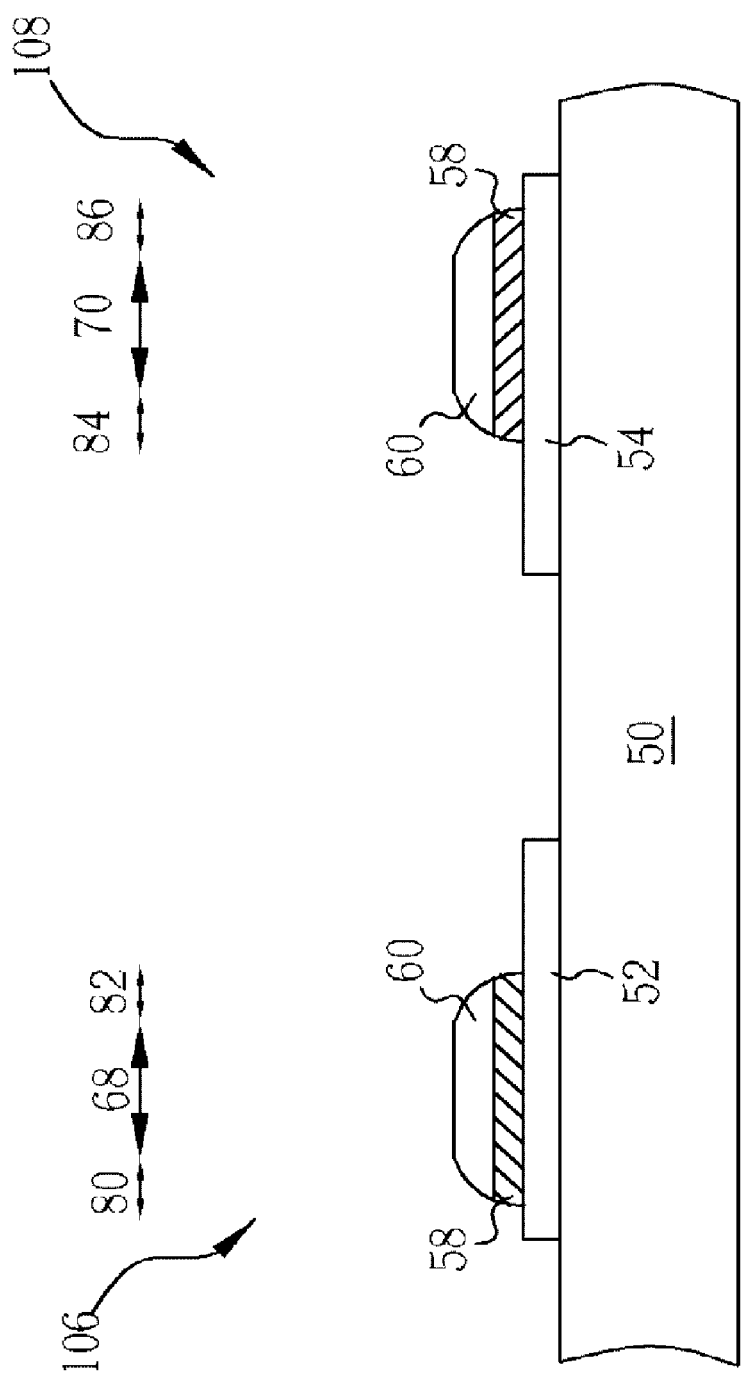

Please refer to FIG. 4 to FIG. 6. FIG. 4 to FIG. 6 are schematic diagrams illustrating a method for manufacturing electrodes of a PDP according to a first preferred embodiment of the present invention. As shown in FIG. 4, a front substrate 50, for example, glass or other transparent boards, is provided. A plurality of transparent electrodes 52 and 54 are formed on the front substrate 50 and a discharge gap 56 is located between the transparent electrodes 52 and 54. The transparent electrodes 52 and 54 consist of indium tin oxide (ITO).

A black photosensitive paste film 58 of negative-working type is coated on the transparent electrodes 52 and 54 for increasing the display contrast of a PDP (not shown in FIG. 4) and then a main photosensitive conductive paste film 60 of negative-working type is coated on the black photosensitive paste film 58.

Figure 7:
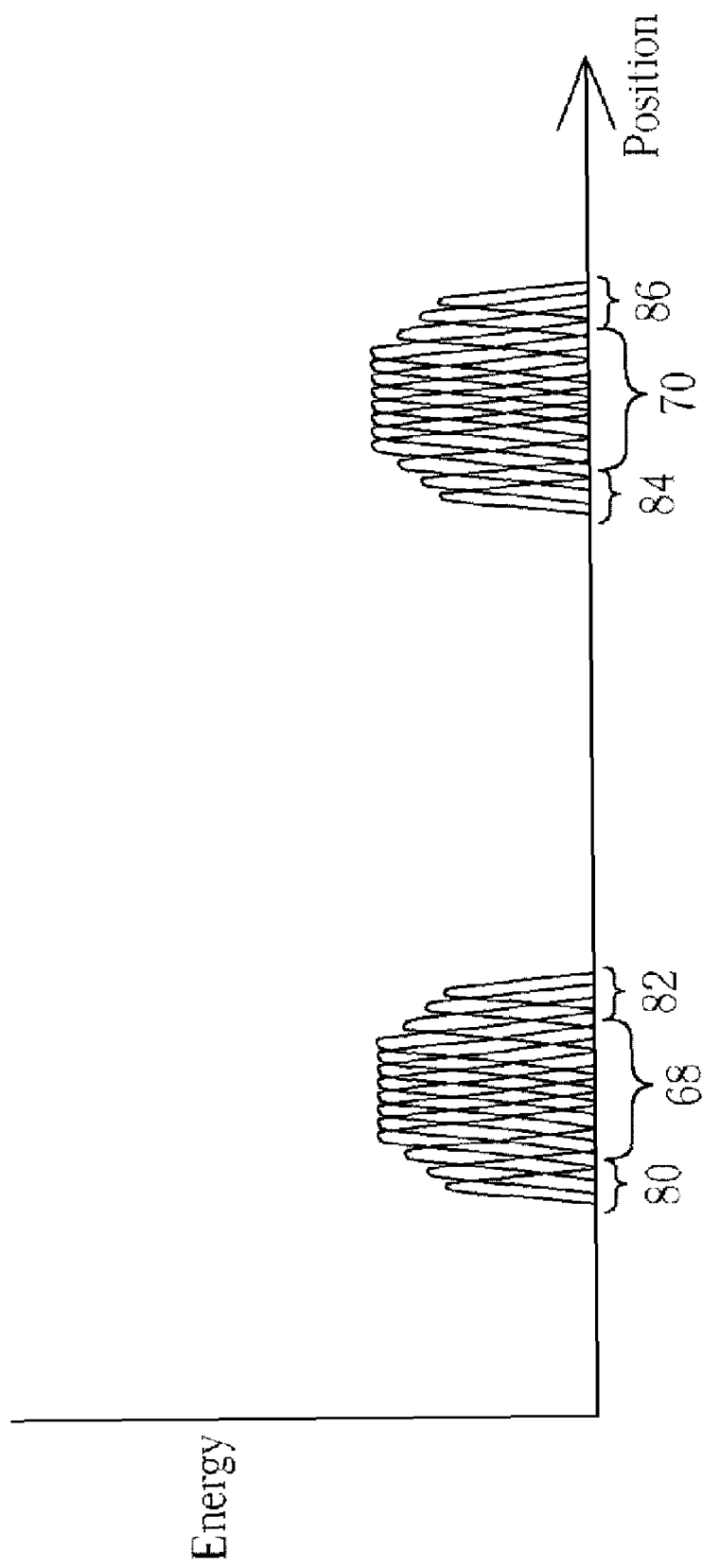
FIG. 7 is a schematic graph for illustrating exposure energies with corresponding positions.

Utilizing a photo mask 62, an exposure process is performed for exposing the black photosensitive paste film 58 and the main photosensitive conductive paste film 60 to define a plurality of bus electrodes (not shown in FIG. 4) on the corresponding transparent electrodes 52 and 54. The photo mask 62 includes a plurality of opening regions 64 and 66 in corresponding main regions 68 and 70 of the bus electrodes and a plurality of fence regions 72, 74, 76, and 78 in corresponding edge regions 80, 82, 84, and 86 of the bus electrodes. The fence regions 72, 74, 76, and 78 include a plurality of parallel slits 88, 90, 92, 94, 96, 98, 100, and 102 parallel to edges of the opening regions 64 and 66. Light 104 such as a collimated ultraviolet (UV) light of the exposure process passes through the opening regions 64 and 66 and the fence regions 72, 74, 76, and 78. Because the fence regions 72, 74, 76, and 78 include the parallel slits 88, 90, 92, 94, 96, 98, 100, and 102, the fence regions 72, 74, 76, and 78 influence the light 104 by an interference effect. Please refer to FIG. 7. FIG. 7 is a schematic graph for illustrating exposure energies with corresponding positions. As shown in FIG. 7, a first exposure energy acting on the main regions 68 and 70 of the bus electrodes is greater than a second exposure energy acting on the edge regions 80, 82, 84, and 86 of the bus electrodes.

As shown in FIG. 5, after the exposure process, a development process is performed to develop the exposed black photosensitive paste film 58 and main photosensitive conductive paste film 60 to form the bus electrodes 106 and 108. Since the second exposure energy acting on the edge regions 80, 82, 84, and 86 of the bus electrodes 106 and 108 is less than the first exposure energy acting on the main regions 68 and 70 of the bus electrodes 106 and 108, a first thickness of the edge regions 80, 82, 84, and 86 of the bus electrodes 106 and 108 is less than a second thickness of the main regions 68 and 70 of the bus electrodes 106 and 108.

As shown in FIG. 6, a firing process is performed for firing the developed black photosensitive paste film 58 and main photosensitive conductive paste film 60 to remove a resin component (not shown in FIG. 6) from the black photosensitive paste film 58 and the main photosensitive conductive paste film 60. Since the first thickness of the edge regions 80, 82, 84, and 86 of the bus electrodes 106 and 108 is less than a second thickness of the main regions 68 and 70 of the bus electrodes 106 and 108, a tensile force occurs while high temperature firing and the edges of the bus electrodes 106 and 108 adhere to the transparent electrodes 52 and 54 well. Therefore, edge curls will not occur.

Figure 8:
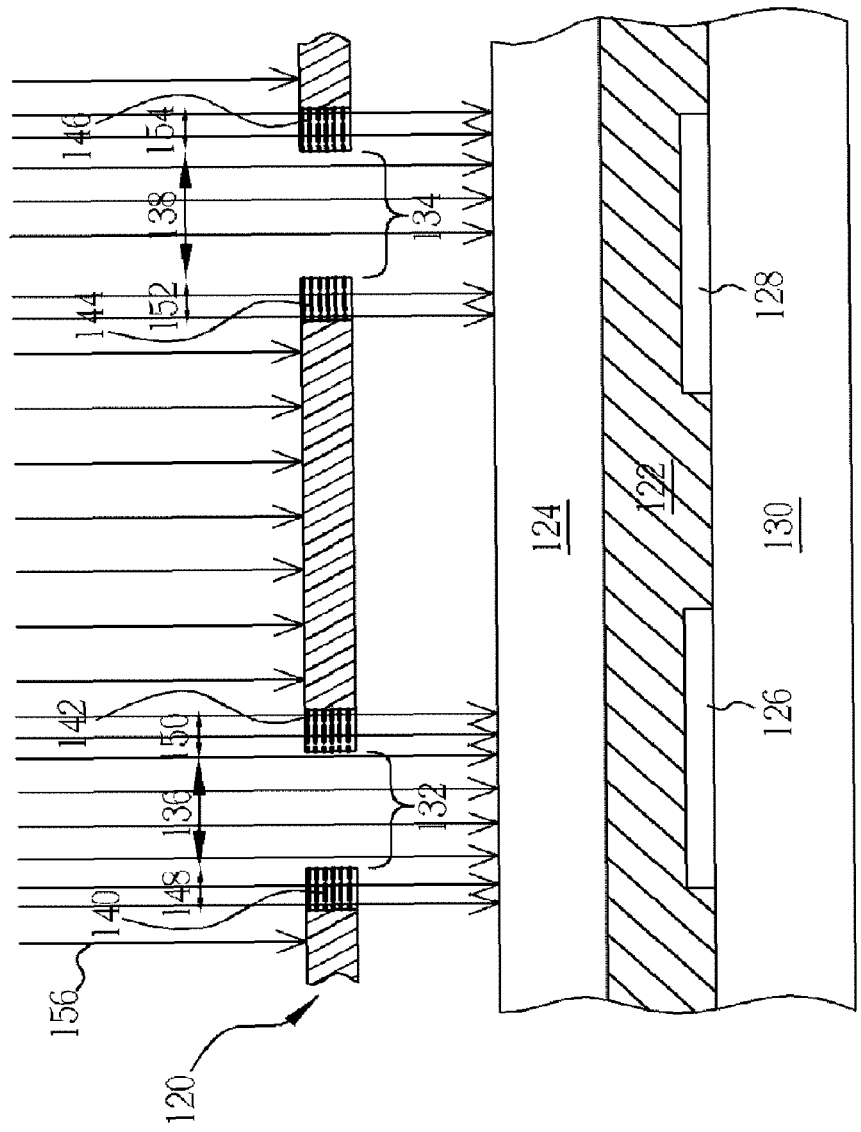
FIG. 8 and FIG. 9 are schematic diagrams illustrating a method for manufacturing electrodes of a PDP according to a second preferred embodiment of the present invention.
Figure 9:
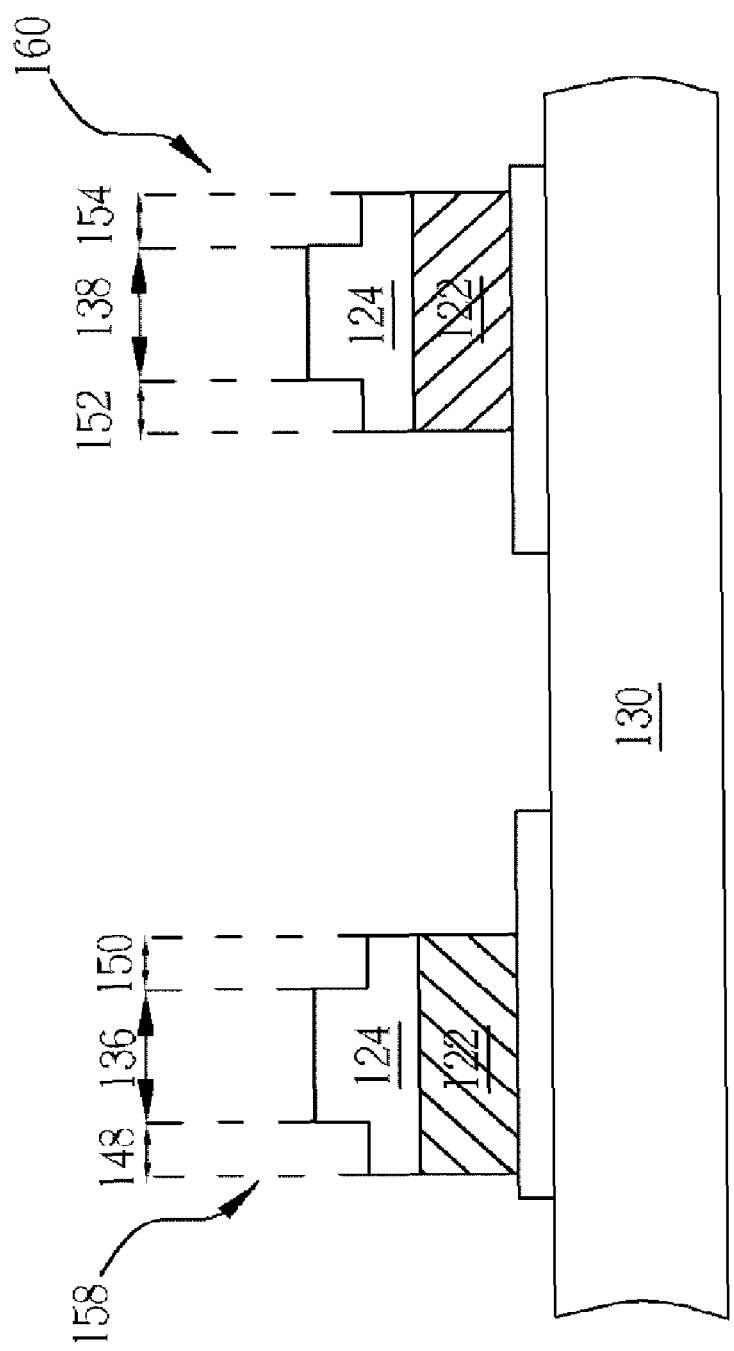

Please refer to FIG. 8 and FIG. 9. FIG. 8 and FIG. 9 are schematic diagrams illustrating a method for manufacturing electrodes of a PDP according to a second preferred embodiment of the present invention. The difference between the first preferred embodiment and the second preferred embodiment is that a halftone mask is utilized to define bus electrodes.

As shown in FIG. 8, utilizing a halftone mask 120, an exposure process is performed for exposing a black photosensitive paste film 122 and a main photosensitive conductive paste film 124 on transparent electrodes 126 and 128 disposed on a front substrate 130 to define a plurality of bus electrodes (not shown in FIG. 8) on the corresponding transparent electrodes 126 and 128. The photo mask 120 includes a plurality of opening regions 132 and 134 in corresponding main regions 136 and 138 of the bus electrodes (not shown in FIG. 8) and a plurality of halftone regions 140, 142, 144, and 146 in corresponding edge regions 148, 150, 152, and 154 of the bus electrodes. Light 156 such as a collimated ultraviolet (UV) light of the exposure process passes through the opening regions 132 and 134 and the halftone regions 140, 142, 144, and 146. Because the light 156 passing through the halftone regions 140, 142, 144, and 146 is reduced, a first exposure energy acting on the main regions 136 and 138 of the bus electrodes is greater than a second exposure energy acting on the edge regions 148, 150, 152, and 154 of the bus electrodes.

As shown in FIG. 9, after the exposure process, a development process is performed to develop the exposed black photosensitive paste film 122 and main photosensitive conductive paste film 124 to form bus electrodes 158 and 160. Since the second exposure energy acting on the edge regions 148, 150, 152, and 154 of the bus electrodes 158 and 160 is less than the first exposure energy acting on the main regions 136 and 138 of the bus electrodes 158 and 160, a first thickness of the edge regions 148, 150, 152, and 154 of the bus electrodes 158 and 160 is less than a second thickness of the main regions 136 and 138 of the bus electrodes 158 and 160. Therefore, in a following firing process, edge curls will not occur.

Figure 10:
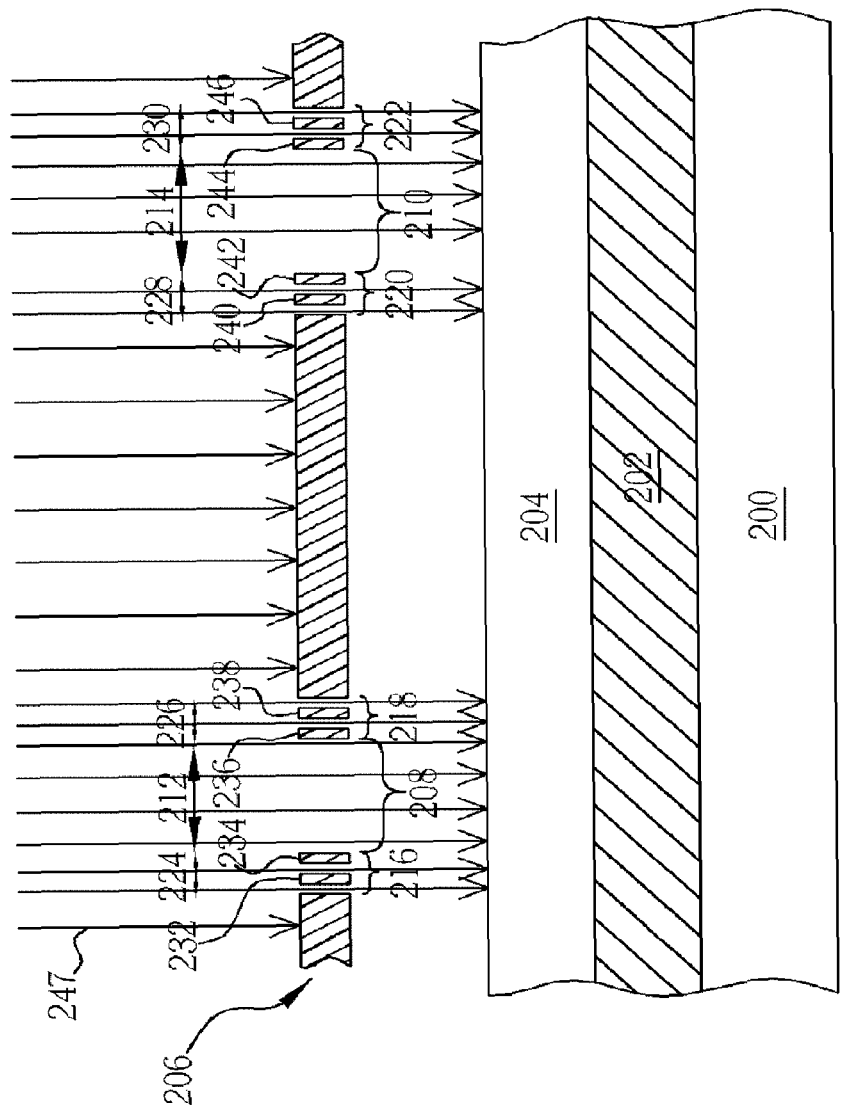
FIG. 10 to FIG. 12 are schematic diagrams illustrating a method for manufacturing electrodes of a PDP according to a third preferred embodiment of the present invention.
Figure 11:
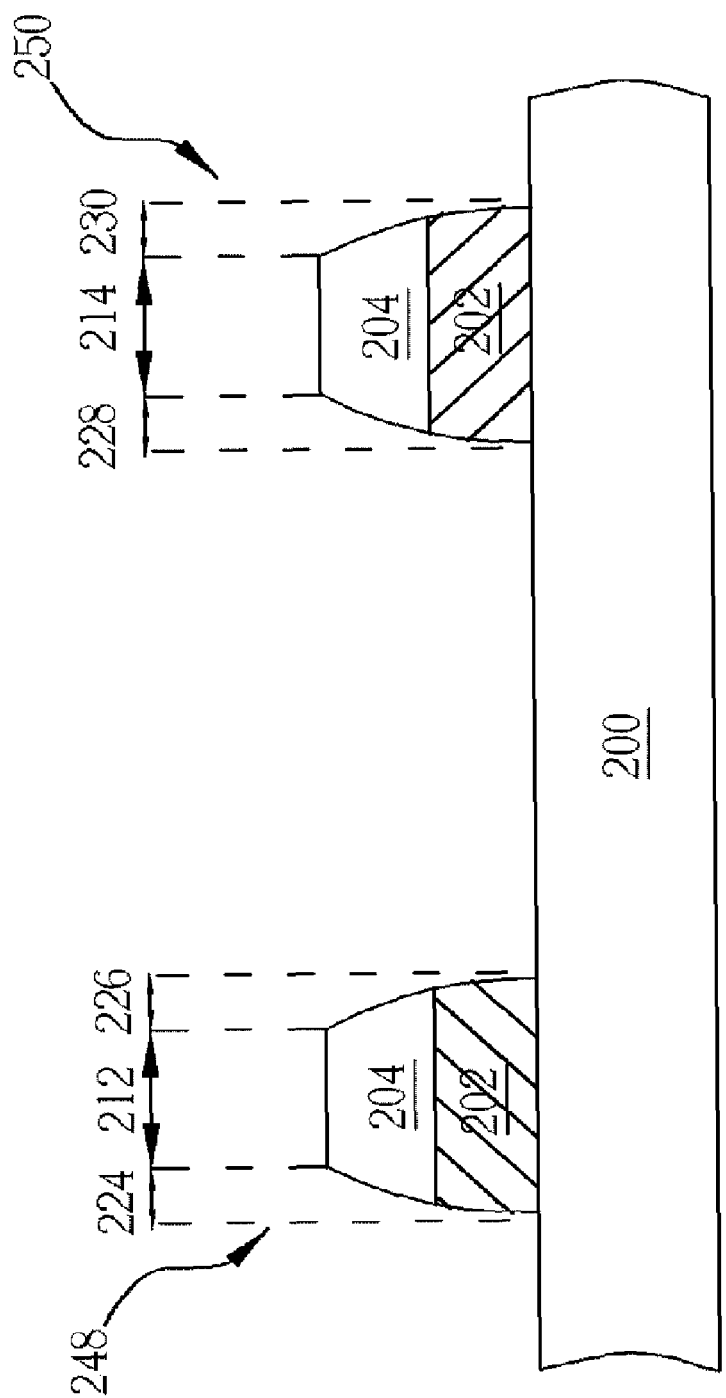
Figure 12:
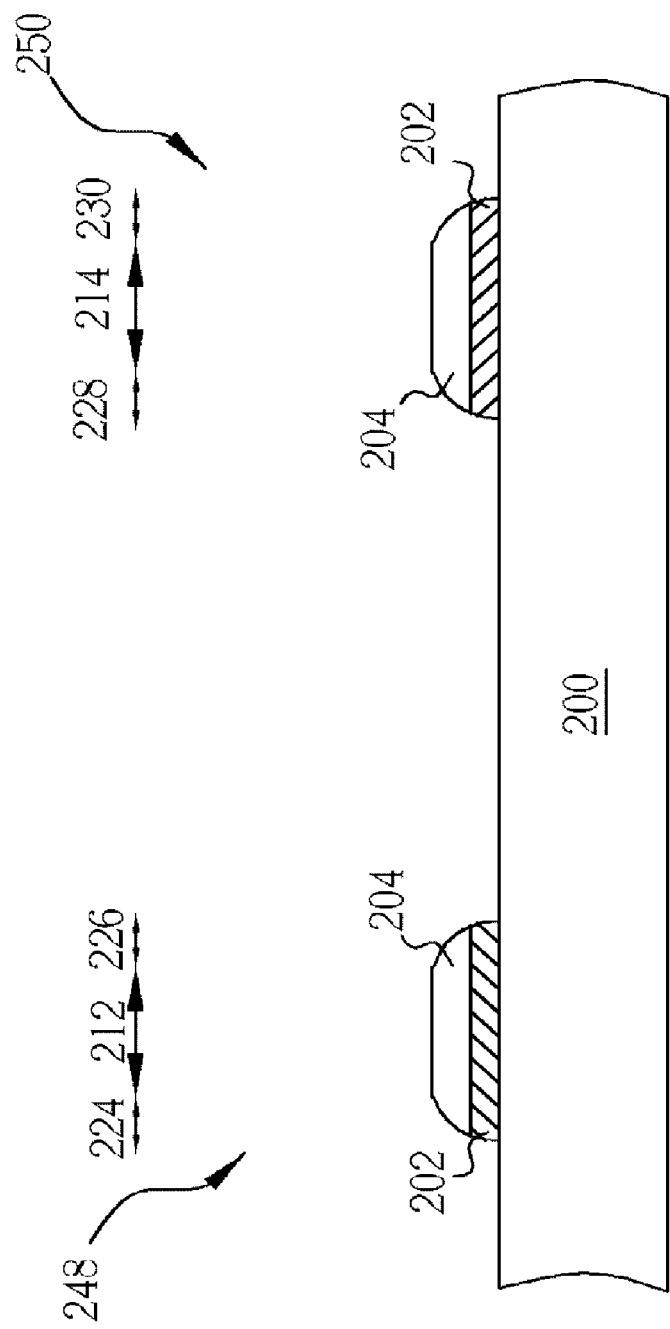

Please refer to FIG. 10 to FIG. 12. FIG. 10 to FIG. 12 are schematic diagrams illustrating a method for manufacturing electrodes of a PDP according to a third preferred embodiment of the present invention. The difference between the third preferred embodiment and the first preferred embodiment is that transparent electrodes are not formed on a front substrate.

As shown in FIG. 10, a front substrate 200, for example, glass or other transparent boards, is provided. A black photosensitive paste film 202 of negative-working type is coated on the front substrate 200 for increasing the display contrast of a PDP (not shown in FIG. 10) and then a main photosensitive conductive paste film 204 of negative-working type is coated on the black photosensitive paste film 202.

Utilizing a photo mask 206, an exposure process is performed for exposing the black photosensitive paste film 202 and the main photosensitive conductive paste film 204 to define a plurality of bus electrodes (not shown in FIG. 10) on the front substrate 200. The photo mask 206 includes a plurality of opening regions 208 and 210 in corresponding main regions 212 and 214 of the bus electrodes and a plurality of fence regions 216, 218, 220, and 222 in corresponding edge regions 224, 226, 228, and 230 of the bus electrodes. The fence regions 216, 218, 220, and 222 include a plurality of parallel slits 232, 234, 236, 238, 240, 242, 244, and 246 parallel to edges of the opening regions 208 and 210. Light 247 such as a collimated ultraviolet (UV) light of the exposure process passes through the opening regions 208 and 210 and the fence regions 216, 218, 220, and 222. Because the fence regions 216, 218, 220, and 222 include the parallel slits 232, 234, 236, 238, 240, 242, 244, and 246, the fence regions 216, 218, 220, and 222 influence the light 247 by an interference effect. A first exposure energy acting on the main regions 212 and 214 of the bus electrodes is greater than a second exposure energy acting on the edge regions 224, 226, 228, and 230 of the bus electrodes.

As shown in FIG. 11, after the exposure process, a development process is performed to develop the exposed black photosensitive paste film 202 and main photosensitive conductive paste film 204 to form the bus electrodes 248 and 250. Since the second exposure energy acting on the edge regions 224, 226, 228, and 230 of the bus electrodes 248 and 250 is less than the first exposure energy acting on the main regions 212 and 214 of the bus electrodes 248 and 250, a first thickness of the edge regions 224, 226, 228, and 230 of the bus electrodes 248 and 250 is less than a second thickness of the main regions 212 and 214 of the bus electrodes 248 and 250.

As shown in FIG. 12, a firing process is performed for firing the developed black photosensitive paste film 202 and main photosensitive conductive paste film 204 to remove a resin component (not shown in FIG. 12) from the black photosensitive paste film 202 and the main photosensitive conductive paste film 204. Since the first thickness of the edge regions 224, 226, 228, and 230 of the bus electrodes 248 and 250 is less than a second thickness of the main regions 212 and 214 of the bus electrodes 248 and 250, a tensile force occurs while high temperature firing and the edges of the bus electrodes 248 and 250 adhere to the front substrate 200 well. Therefore, edge curls will not occur.

Figure 13:
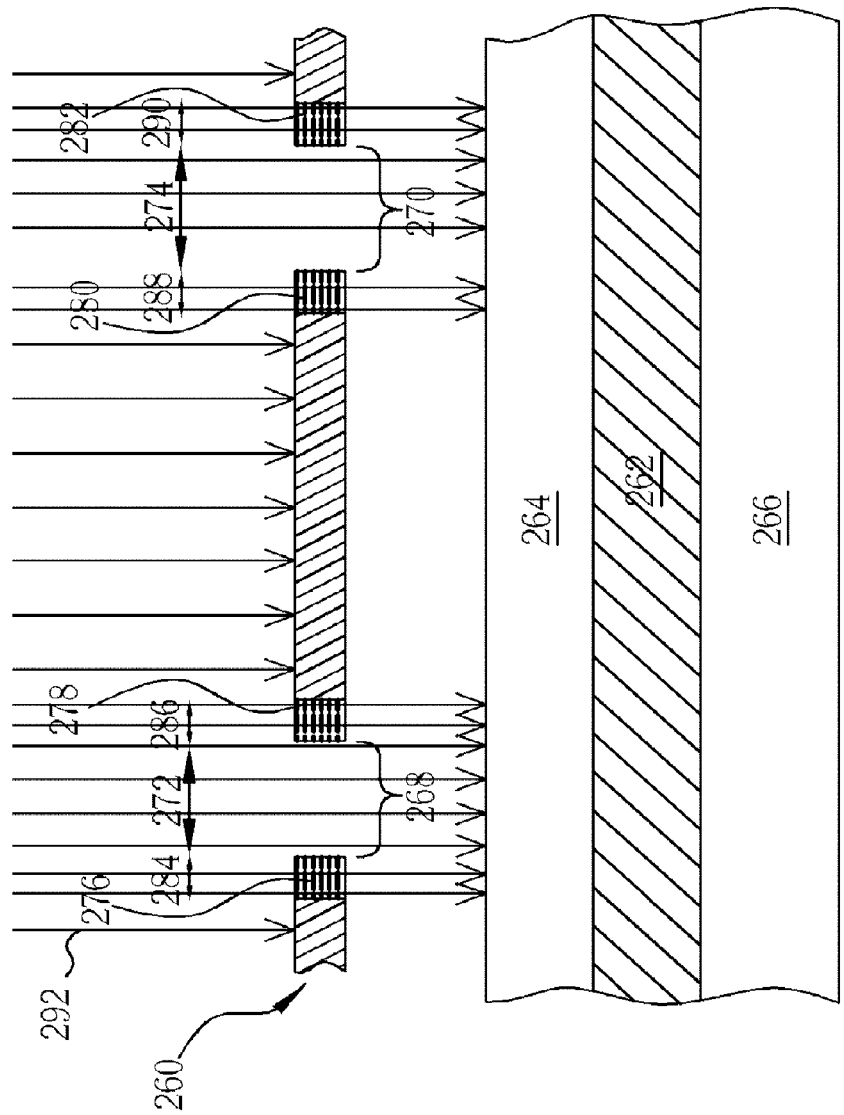
FIG. 13 and FIG. 14 are schematic diagrams illustrating a method for manufacturing electrodes of a PDP according to a fourth preferred embodiment of the present invention.
Figure 14:
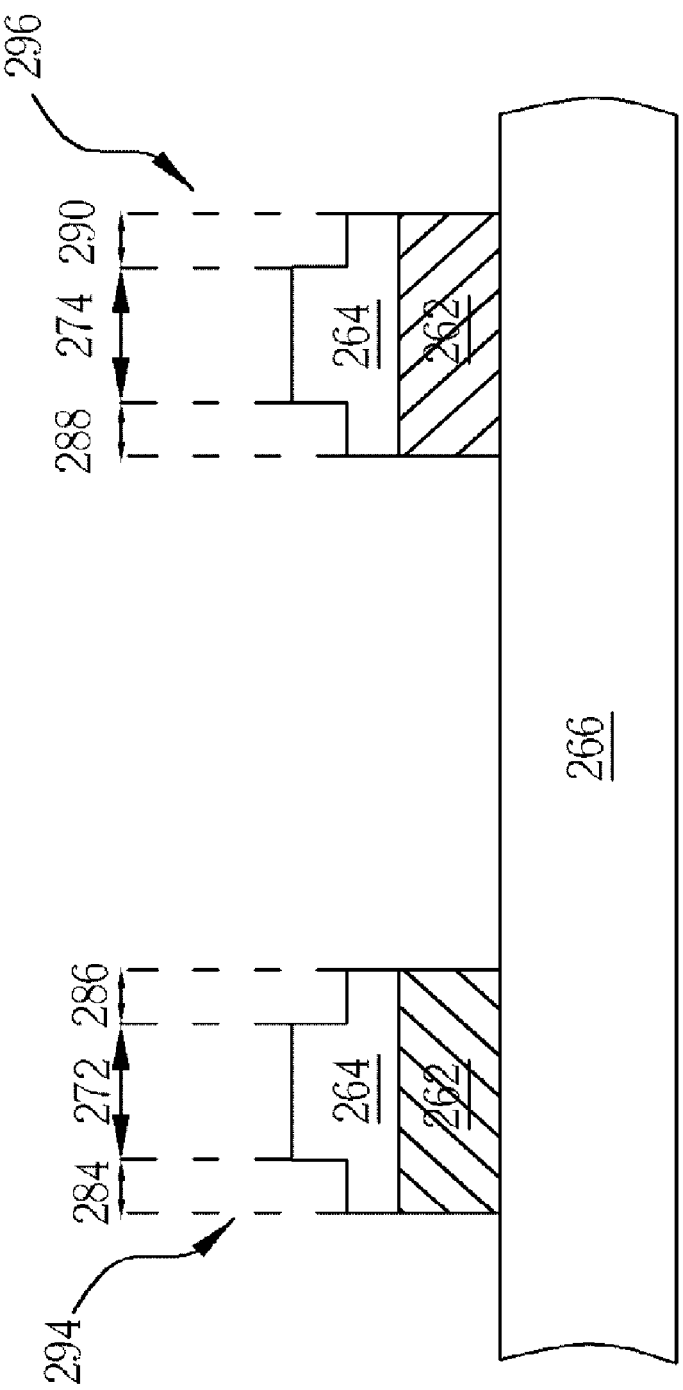

Please refer to FIG. 13 and FIG. 14. FIG. 13 and FIG. 14 are schematic diagrams illustrating a method for manufacturing electrodes of a PDP according to a fourth preferred embodiment of the present invention. The difference between the fourth preferred embodiment and the third preferred embodiment is that a halftone mask is utilized to define bus electrodes.

As shown in FIG. 13, utilizing a half tone mask 260, an exposure process is performed for exposing a black photosensitive paste film 262 and a main photosensitive conductive paste film 264 on a front substrate 266 to define a plurality of bus electrodes (not shown in FIG. 13) on the front substrate 266. The photo mask 260 includes a plurality of opening regions 268 and 270 in corresponding main regions 272 and 274 of the bus electrodes (not shown in FIG. 13) and a plurality of halftone regions 276, 278, 280, and 282 in corresponding edge regions 284, 286, 288, and 290 of the bus electrodes. Light 292 such as a collimated ultraviolet (UV) light of the exposure process passes through the opening regions 268 and 270 and the halftone regions 276, 278, 280, and 282. Because the light 292 passing through the halftone regions 276, 278, 280, and 282 is reduced, a first exposure energy acting on the main regions 272 and 274 of the bus electrodes is greater than a second exposure energy acting on the edge regions 284, 286, 288, and 290 of the bus electrodes.

As shown in FIG. 14, after the exposure process, a development process is performed to develop the exposed black photosensitive paste film 262 and main photosensitive conductive paste film 264 to form bus electrodes 294 and 296. Since the second exposure energy acting on the edge regions 284, 286, 288, and 290 of the bus electrodes 294 and 296 is less than the first exposure energy acting on the main regions 272 and 274 of the bus electrodes 294 and 296, a first thickness of the edge regions 284, 286, 288, and 290 of the bus electrodes 294 and 296 is less than a second thickness of the main regions 272 and 274 of the bus electrodes 294 and 296. Therefore, in a following firing process, edge curls will not occur.

Please refer to FIG. 15 to FIG. 18. FIG. 15 to FIG. 18 are schematic diagrams illustrating a method for manufacturing electrodes of a PDP according to a fifth preferred embodiment of the present invention. The difference between the fifth preferred embodiment and the first preferred embodiment is that the fifth preferred embodiment illustrates a method for forming address electrodes on a rear substrate.

Figure 15:
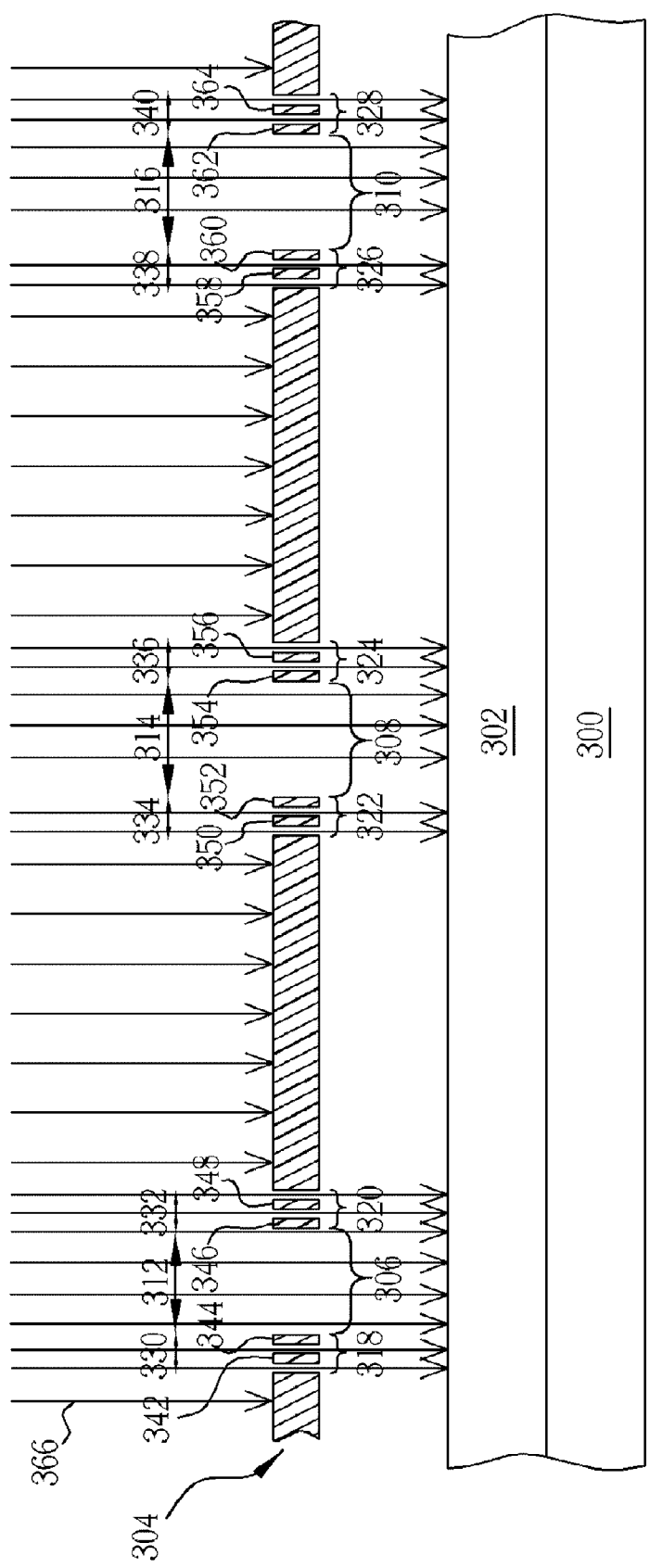
FIG. 15 to FIG. 18 are schematic diagrams illustrating a method for manufacturing electrodes of a PDP according to a fifth preferred embodiment of the present invention.

As shown in FIG. 15, a rear substrate 300, for example, glass or other transparent boards, is provided. A photosensitive conductive paste film 302 of negative-working type is coated on the rear substrate 300.

Utilizing a photo mask 304, an exposure process is performed for exposing the photosensitive conductive paste film 302 to define a plurality of address electrodes (not shown in FIG. 15) on the rear substrate 300. The photo mask 304 includes a plurality of opening regions 306, 308 and 310 in corresponding main regions 312, 314 and 316 of the address electrodes and a plurality of fence regions 318, 320, 322, 324, 326 and 328 in corresponding edge regions 330, 332, 334, 336, 338 and 340 of the address electrodes. The fence regions 318, 320, 322, 324, 326 and 328 include a plurality of parallel slits 342, 344, 346, 348, 350, 352, 354, 356, 358, 360, 362 and 364 parallel to edges of the opening regions 306, 308 and 310. Light 366 such as a collimated ultraviolet (UV) light of the exposure process passes through the opening regions 306, 308 and 310 and the fence regions 318, 320, 322, 324, 326 and 328. Because the fence regions 318, 320, 322, 324, 326 and 328 include the parallel slits 342, 344, 346, 348, 350, 352, 354, 356, 358, 360, 362 and 364, the fence regions 318, 320, 322, 324, 326 and 328 influence the light 366 by an interference effect. A first exposure energy acting on the main regions 312, 314 and 316 of the address electrodes is greater than a second exposure energy acting on the edge regions 330, 332, 334, 336, 338 and 340 of the address electrodes.

Figure 16:
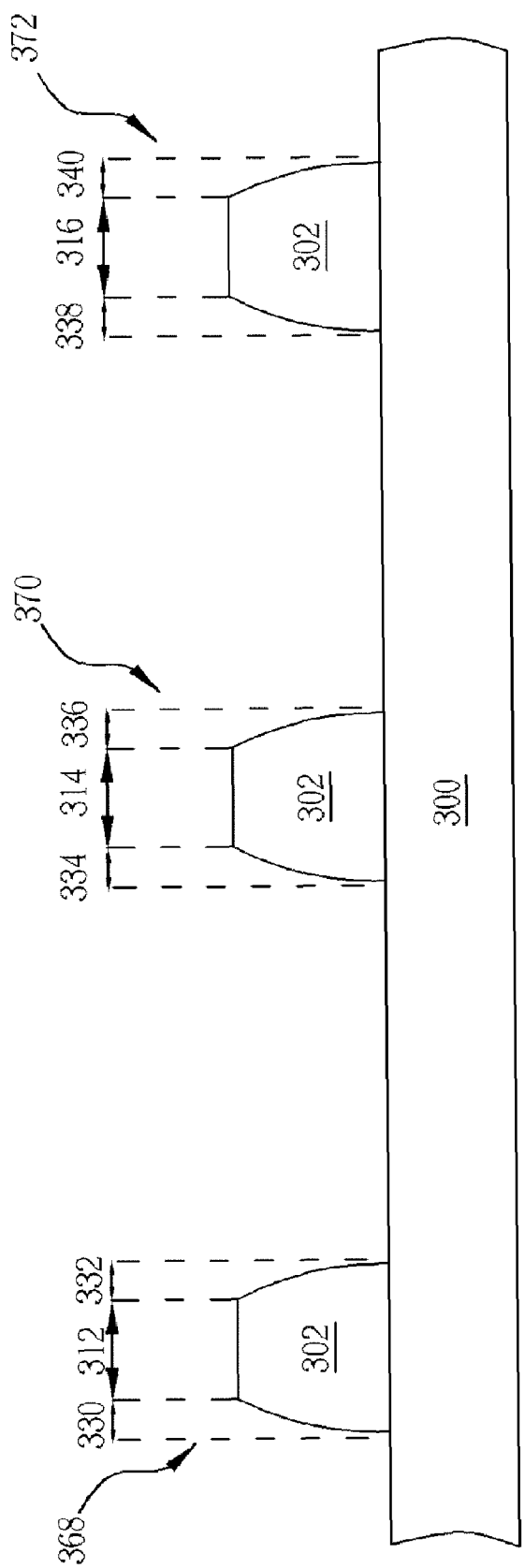

As shown in FIG. 16, after the exposure process, a development process is performed to develop the photosensitive conductive paste film 302 to form the address electrodes 368, 370 and 372. Since the second exposure energy acting on the edge regions 330, 332, 334, 336, 338 and 340 of the address electrodes 368, 370 and 372 is less than the first exposure energy acting on the main regions 312, 314 and 316 of the address electrodes 368, 370 and 372, a first thickness of the edge regions 330, 332, 334, 336, 338 and 340 of the address electrodes 368, 370 and 372 is less than a second thickness of the main regions 312, 314 and 316 of the address electrodes 368, 370 and 372.

Figure 17:
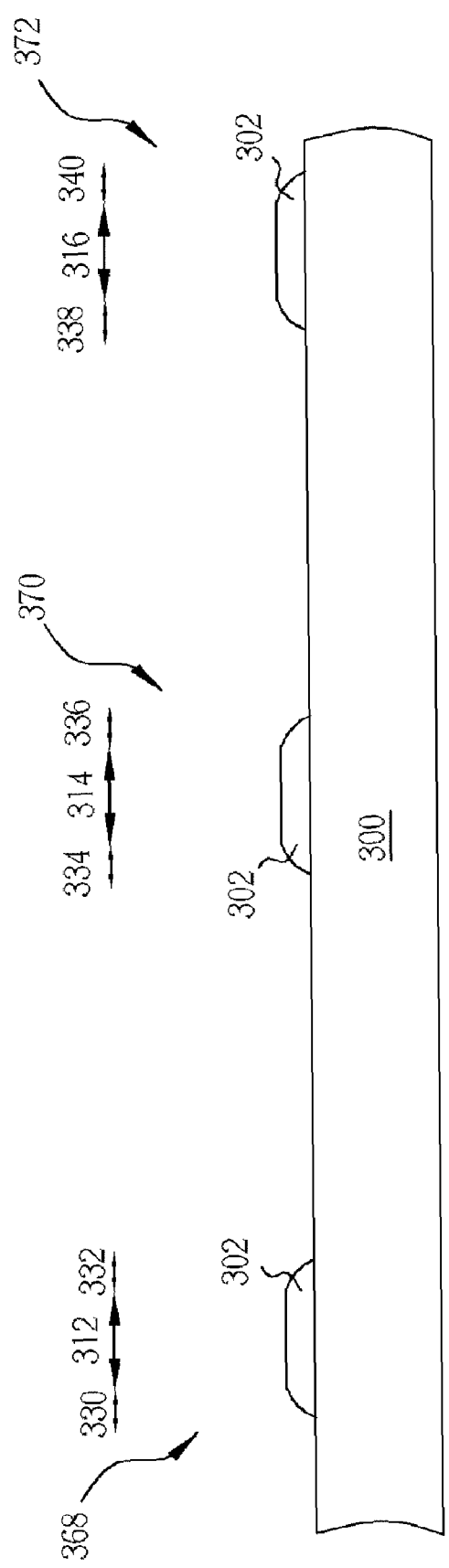

As shown in FIG. 17, a firing process is performed for firing the developed photosensitive conductive paste film 302 to remove a resin component (not shown in FIG. 17) from the photosensitive conductive paste film 302. Since the first thickness of the edge regions 330, 332, 334, 336, 338 and 340 of the address electrodes 368, 370 and 372 is less than a second thickness of the main regions 312, 314 and 316 of the address electrodes 368, 370 and 372, a tensile force occurs while high temperature firing and the edges of the address electrodes 368, 370 and 372 adhere to the rear substrate 300 well. Therefore, edge curls will not occur.

Figure 18:
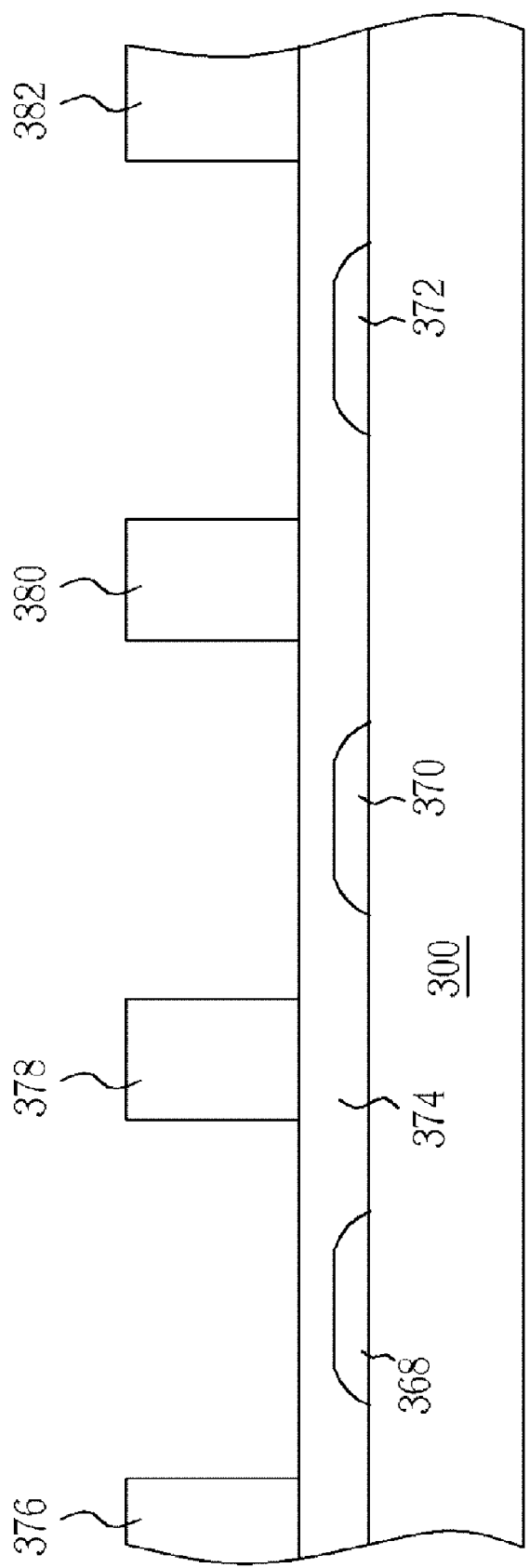

As shown in FIG. 18, a dielectric layer 374 is formed on the address electrodes 368, 370 and 372 and the rear substrate 300. Then, a plurality of barrier ribs 376, 378, 380 and 382 are formed on the dielectric layer 374.

Figure 19:
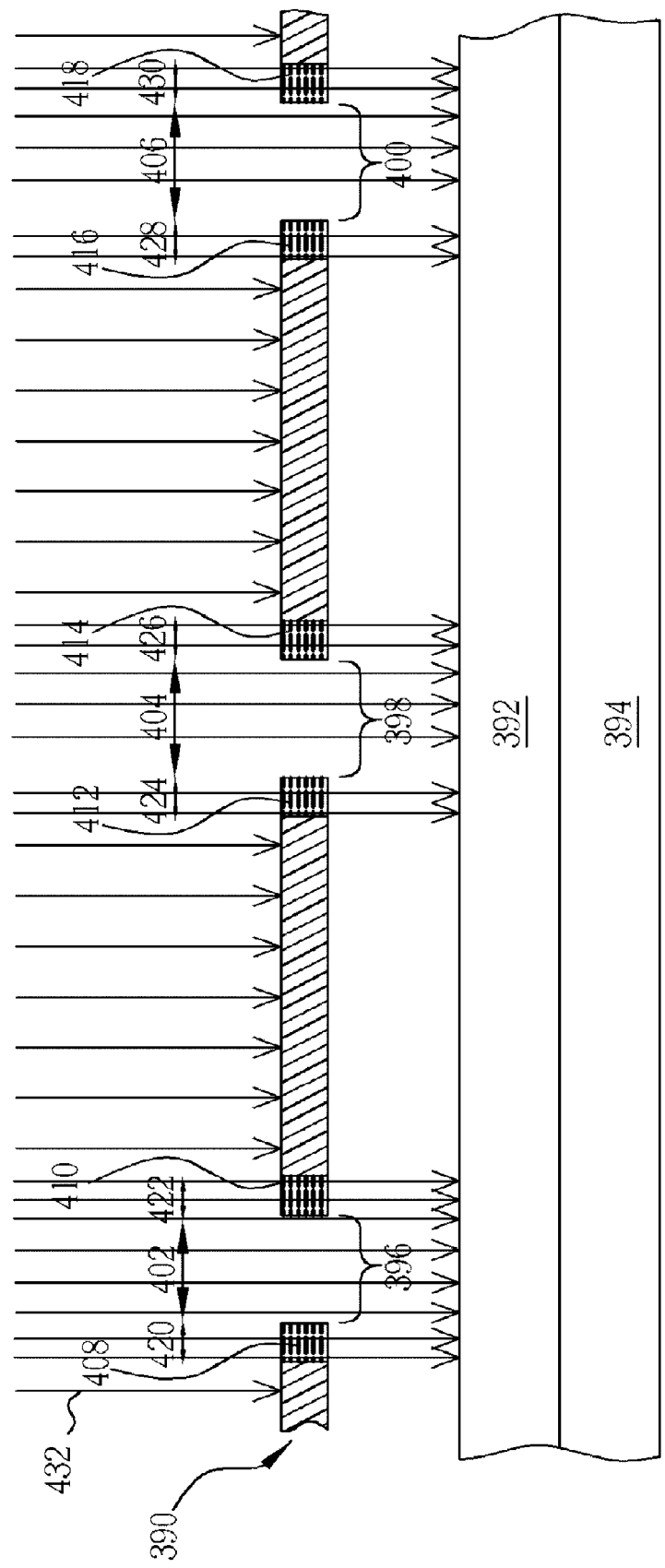
FIG. 19 and FIG. 20 are schematic diagrams illustrating a method for manufacturing electrodes of a PDP according to a sixth preferred embodiment of the present invention.
Figure 20:
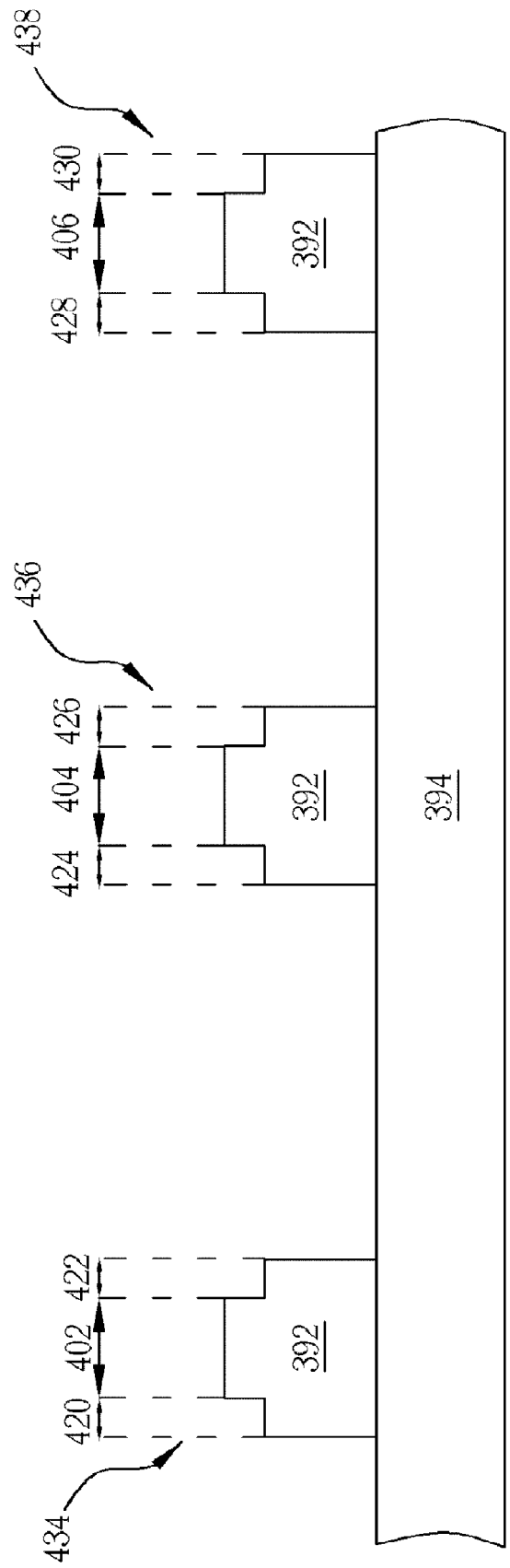

Please refer to FIG. 19 and FIG. 20. FIG. 19 and FIG. 20 are schematic diagrams illustrating a method for manufacturing electrodes of a PDP according to a sixth preferred embodiment of the present invention. The difference between the sixth preferred embodiment and the fifth preferred embodiment is that a halftone mask is utilized to define address electrodes.

As shown in FIG. 19, utilizing a half tone mask 390, an exposure process is performed for exposing a photosensitive conductive paste film 392 on a rear substrate 394 to define a plurality of address electrodes (not shown in FIG. 19) on the rear substrate 394. The photo mask 390 includes a plurality of opening regions 396, 398 and 400 in corresponding main regions 402, 404 and 406 of the address electrodes (not shown in FIG. 19) and a plurality of halftone regions 408, 410, 412, 414, 416 and 418 in corresponding edge regions 420, 422, 424, 426, 428 and 430 of the address electrodes. Light 432 such as a collimated ultraviolet (UV) light of the exposure process passes through the opening regions 396, 398 and 400 and the halftone regions 408, 410, 412, 414, 416 and 418. Because the light 432 passing through the halftone regions 408, 410, 412, 414, 416 and 418 is reduced, a first exposure energy acting on the main regions 402, 404 and 406 of the address electrodes is greater than a second exposure energy acting on the edge regions 420, 422, 424, 426, 428 and 430 of the address electrodes.

As shown in FIG. 20, after the exposure process, a development process is performed to develop the exposed photosensitive conductive paste film 392 to form address electrodes 434, 436 and 438. Since the second exposure energy acting on the edge regions 420, 422, 424, 426, 428 and 430 of the address electrodes 434, 436 and 438 is less than the first exposure energy acting on the main regions 402, 404 and 406 of the address electrodes 434, 436 and 438, a first thickness of the edge regions 420, 422, 424, 426, 428 and 430 of the address electrodes 434, 436 and 438 is less than a second thickness of the main regions 402, 404 and 406 of the address electrodes 434, 436 and 438. Therefore, in a following firing process, edge curls will not occur.

Compared to the prior art, it is an advantage of the present invention that the manufactured bus and address electrodes are capable of preventing the edge curl and then reducing the breakdown probability of dielectrics near edges of the bus and address electrodes.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for manufacturing electrodes of a plasma display panel, comprising:
providing a front transparent substrate;
coating a black photosensitive paste film of negative-working type on the transparent substrate;
coating a main photosensitive conductive paste film of negative-working type on the black photosensitive paste film, wherein the black photosensitive paste film and the main photosensitive conductive paste film both comprise a resin component;
performing an exposure process using a collimated ultraviolet (UV) light for exposing the black photosensitive paste film and the main photosensitive conductive paste film to define a plurality of bus electrodes on the transparent substrate, wherein a first exposure energy acting on a plurality of main regions of the bus electrodes is greater than a second exposure energy acting on a plurality of edge regions of the bus electrodes;
performing a development process to develop the exposed black photosensitive paste film and main photosensitive conductive paste film to form the bus electrodes, in which a first thickness of the edge regions of the bus electrodes is less than a second thickness of the main regions of the bus electrodes, and the developed black photosensitive paste film and the developed main photosensitive conductive paste film together form a trapezoid; and
performing a firing process to fire the developed black photosensitive paste film and main photosensitive conductive paste film.

2. The method for manufacturing electrodes of a plasma display panel of claim 1, wherein a photo mask, which has a plurality of opening regions in the corresponding main regions of the bus electrodes and a plurality of fence regions in the corresponding edge regions of the bus electrodes, is utilized to perform the exposure process.

3. The method for manufacturing electrodes of a plasma display panel of claim 2, wherein the fence regions comprise at least a parallel slit parallel to edges of the opening regions.

4. The method for manufacturing electrodes of a plasma display panel of claim 2, wherein light of the exposure process passing through the fence regions is influenced by an interference effect such that the second exposure energy acting on the edge regions of the bus electrodes is less than the first exposure energy acting on the main regions of the bus electrodes.

5. The method for manufacturing electrodes of a plasma display panel of claim 1, wherein a halftone mask, which has a plurality of opening regions in the corresponding main regions of the bus electrodes and a plurality of halftone regions in the corresponding edge regions of the bus electrodes, is utilized to perform the exposure process.

6. The method for manufacturing electrodes of a plasma display panel of claim 5, wherein light of the exposure process passing through the halftone regions is reduced such that the second exposure energy acting on the edge regions of the bus electrodes is less than the first exposure energy acting on the main regions of the bus electrodes.

7. The method for manufacturing electrodes of a plasma display panel of claim 1, wherein the front transparent substrate consists of glass.

8. The method for manufacturing electrodes of a plasma display panel of claim 1 further comprising forming a plurality of transparent electrodes on the front transparent substrate before the black photosensitive paste film of negative-working type is coated.

9. The method for manufacturing electrodes of a plasma display panel of claim 8, wherein the transparent electrodes consist of indium tin oxide (ITO).

10. The method for manufacturing electrodes of a plasma display panel of claim 1, wherein the firing process is used to remove the resin component from the black photosensitive paste film and the main photosensitive conductive paste film.

* * * * *